July 18, 1961 R. P. RIESZ 2,992,471

FORMATION OF P-N JUNCTIONS IN P-TYPE SEMICONDUCTORS

Filed Nov. 4, 1958 3 Sheets-Sheet 1

INVENTOR
R. P. RIESZ
BY Harry C. Hart
ATTORNEY

July 18, 1961 R. P. RIESZ 2,992,471
FORMATION OF P-N JUNCTIONS IN P-TYPE SEMICONDUCTORS
Filed Nov. 4, 1958 3 Sheets-Sheet 2

INVENTOR
R. P. RIESZ
BY Harry C. Hart
ATTORNEY

FORMATION OF P-N JUNCTIONS IN P-TYPE SEMICONDUCTORS

Filed Nov. 4, 1958 3 Sheets-Sheet 3

INVENTOR
R. P. RIESZ
BY Harry C. Hart
ATTORNEY 2,992,471
Patented July 18, 1961

2,992,471

FORMATION OF P-N JUNCTIONS IN P-TYPE SEMICONDUCTORS

Richard P. Riesz, Berkeley Heights, N.J., assignor to Bell Telephone Laboratories, Incorporated, New York, N.Y., a corporation of New York Filed Nov. 4, 1958, Ser. No. 771, 910
4 Claims. (Cl. 29—25.3)

This invention deals with germanium rectifier devices and with methods of fabricating them. Its principal object is to improve the performance of such devices.

Modern equipment for the processing of data and other information on a digital basis places heavy demands on the characteristics of diode rectifiers, both their current-voltage characteristics and their swtiching speeds, and has focused attention on the comparative merits of diode rectifiers of different kinds. As a result it has been established that germanium rectifiers of the diffused junction type have excellent current-voltage characteristics under steady state conditions but that their switching characteristics are unsatisfactory: they are sluggish. This holds equally for a germanium diode having a body of P-type conductivity and a diffused surface layer of N-type conductivity, and for one having an N-type body and a P-type diffused surface layer.

On the other hand, and provided the semiconductor body be of N-type conductivity a gold wire electrode, enriched or "doped" with acceptor impurities can be bonded to the body, in contrast to alloying it to a P-type surface layer. The bonding operation results in a regrown region consisting of gold-germanium alloy and having the form of a cap surrounding the tip of the gold wire where the latter is imbedded in the germanium body, and cropping out on the germanium surface in a small ring around the gold wire. The outer face or periphery of this regrown cap is a bonded P-N rectifier junction. This construction makes for excellent performance, both in the sense of a very sharp steady state current-voltage characteristic and very high switching speed. Indeed, such gold-bonded diodes can be fabricated with forward resistance as low as a few ohms, reverse resistance as high as a million ohms, breakdown voltage of 20 volts or higher, internal capacitance of two micromicrofarads or less, and switching times as low as 1–2 millimicroseconds. Such a diode rectifier is evidently well suited for use as a component of apparatus for carrying out logical operations at high speeds.

As a matter of convenience and economy of space, and in order to reduce parasitic impedances for high speed circuitry, it is sometimes desirable to fabricate multiple diodes of this type on a single wafer of semiconductor, i.e., units of which each one has a plurality of anodes (or cathodes) and a single cathode (or anode). For symmetrical circuitry it is sometimes also desirable to provide two such multiple-junction devices, i.e., one having a common cathode, in which the conductivity of the wafer is N-type, and one having a common anode in which it is P-type. No difficulty attends the fabrication of multiple gold-bonded diodes on a single slab of N-type germanium.

Attempts to fabricate gold-bonded diodes of P-type germanium have in the past resulted in units that fail to meet the high performance standards set by the equipment designers. In general, such diodes have suffered from low reverse resistance and a lack of the required sharp break in the reverse current-voltage characteristic at the point where avalanche breakdown occurs. This is figuratively termed a "soft breakdown knee."

The present invention provides a P-type germanium-to-metal diode rectifier of the bonded junction variety of which both the current-voltage characteristic and the speed of response are excellent. An important structural departure of the new rectifier from its predecessors is that the outcrop of the alloy cap on the surface of the germanium body around the tip of the metal electrode no longer defines a P-N junction. This novel configuration is attained, in accordance with the invention, by first creating on the surface of the P-type germanium body, and preferably on only a small but sufficient portion of its surface, an auxiliary superficial layer of N-type conductivity, thus to provide an auxiliary subsurface P-N junction; and only then forming the bond to the P-type body by piercing this superficial layer and the subjacent junction in the bonding operation.

The auxiliary superficial N-type layer may be a mere micron or so in thickness and is preferably formed by diffusing donor impurities into the surface of the P-type germanium body. A subsurface P-N junction thus formed has a favorable current-voltage characteristic. As a rule, however, it is sluggish in its rectifier action. With the new construction the bonded junction, i.e., the outer surface of the bonded alloy cap, is contiguous with the unpierced portion of the diffused junction. Though the alloy cap itself crops out on the surface of the body in a ring surrounding the bonded electrode, the materials on either side of the outcrop are both of N-type conductivity. Hence this outcrop has no rectifying junction properties, and the only outcrop of any rectifier junction on the surface of the body is found at a part of the surface of the body where the auxiliary diffused layer may have been removed.

Because of the marked improvement in behavior which characterizes a germanium rectifier thus fabricated, it may be surmised that the inferior current-voltage characteristics of the ordinary bonded P-type germanium junction may have been in some way associated with the outcrop of the periphery of the alloy cap on the P-type surface of the body as a P-N junction in a circle surrounding the donor-doped metal electrode, and to intricate electrical interactions, not fully understood, between the exposed P-N junction thus formed and the exposed surface of the P-type body. The N-type surface layer created by the diffusion process appears to shield the internal portion of the regrown cap, i.e., that part of it that is, indeed, a P-N junction, from such harmful surface effects. The outcrop of the diffused P-N junction, to the contrary, has no harmful effects.

From the electrical standpoint the auxiliary diffused junction is in parallel with the bonded junction. Because of its sluggish behavior its effects are preferably minimized. Advantageously, therefore, the auxiliary N-type layer may be restricted to one or more spots of the surface of the body, each such spot being pierced, in accordance with the invention, by a single bonding electrode. Each such spot need be only so large as to ensure that it shall completely surround the bonding electrode.

The invention will be fully apprehended from the following detailed description of an illustrative fabrication process and of the resulting rectifier structure, taken in connection with the appended drawings in which.

Figure 1:
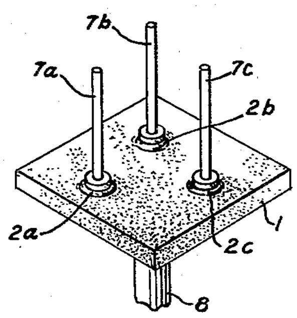
FIG. 1 is a perspective view showing a triple diode rectifier fabricated in accordance with the invention.

Referring now to the drawings, FIG. 1 shows a wafer 1 of P-type germanium material having on the upper surface thereof three circular islands or "mesas" 2*a*, 2*b*, 2*c*, each comprising a superficial layer of N-type material pierced by a metal electrode 7 that is bonded, below the layer, to the P-type germanium body. A single metal stud 8 is alloyed to the lower surface of the body thus to form an ohmic connection thereto. Thus, FIG. 1 represents a triple rectifier: three rectifiers having individual cathodes and a common anode.

Figure 2:
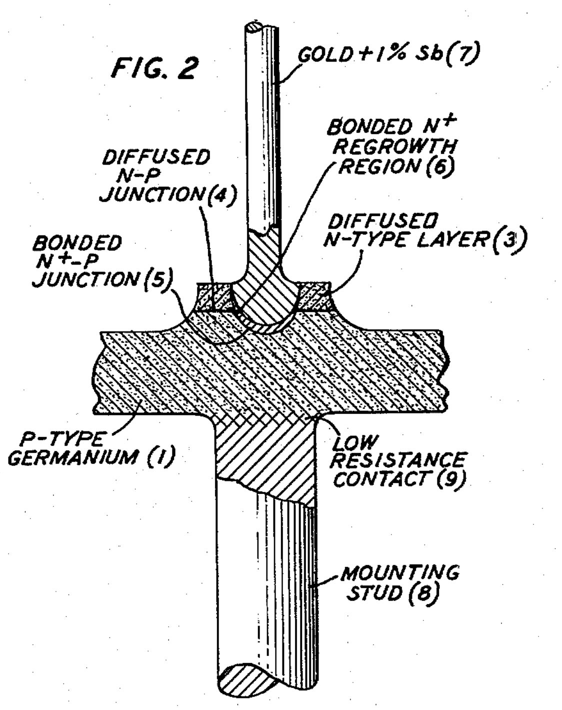
FIG. 2 is a cross-sectional view, to an enlarged scale, of a portion of the rectifier of FIG. 1, showing its internal structural details.

The invention resides in part in the internal structure of the rectifier of FIG. 1 as illustrated in detail in FIG. 2 which, not being drawn to scale, emphasizes the significant structural features, and in part in the process of fabricating it. Therefore the process and the consequent structure will be described together.

Figure 4:
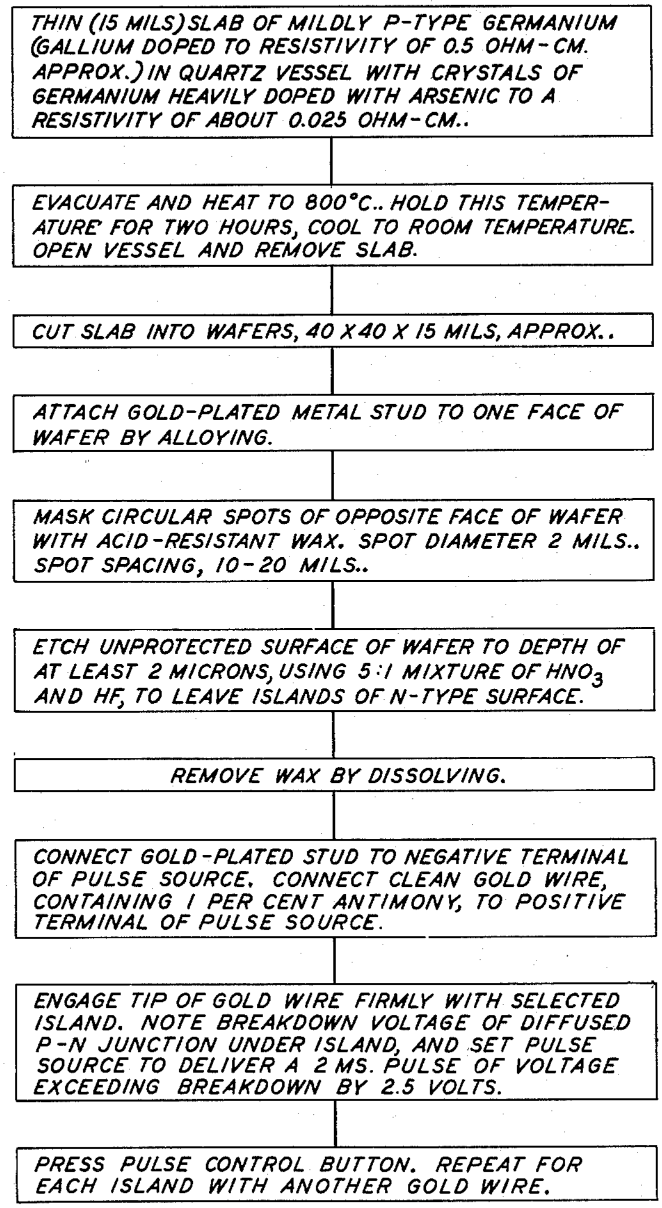
FIG. 4 is an operational diagram of one form of the method employed for fabricating a P-type germanium-bonded electrode rectifier in accordance with the invention.

For a preferred example of the process, reference may be made to FIG. 4 in which the various steps are tabulated. The process may be advantageously commenced with a thin slab of germanium of mildly P-type conductivity, e.g., of resistivity in the range 0.2 to 1.0 ohm-cm. The P-type conductivity is the consequence of inclusion, within the slab, of acceptor impurities, e.g., gallium, indium, or aluminum. The resistivity results from the control of the proportions of such impurities. Germanium thus "doped" with controlled amounts of selected impurities, distributed with a high degree of uniformity throughout its volume, may be prepared by the so-called "zone levelling" technique which forms the subject of W.G. Pfann Patent 2,739,088, March 20, 1956.

After lapping and etching, one or more such thin slabs are placed in a quartz tube along with crystals of strongly N-type germanium, e.g., germanium that has been heavily doped with a donor impurity such as arsenic, in amounts such as to make for a resistivity of 0.025 ohm-cm.

The quartz tube is next sealed and evacuated. It is then raised to a temperature of about 800 degrees centigrade and maintained at that temperature for a period of about two hours. At such a temperature some of the arsenic diffuses out of the arsenic-doped crystals and diffuses into all surfaces of the P-type germanium slab. The result of this diffusion process is to form, on all surfaces of the germanium slab, a superficial layer 3 (FIG. 2) of N-type conductivity and, at the interface between the N-type layer and the P-type body, a P-N junction 4. Continuation of the diffusion process for two hours makes for a thickness of this N-type superficial layer of one micron or so, which is sufficient. The layer should be thin: from one to ten microns.

The quartz tube is then allowed to cool and is opened. The P-type slab, bearing its N-type superficial layer, is next cut into rectangular wafers 1 of about 40 mils on each side and of the same thickness as the slab, namely 15 mils or so. Each of these wafers bears on each of its major surfaces an N-type layer.

The alloying of a stud 8, to serve as the common anode, to one side of the wafer 1 and the bonding of donor-doped gold wires 7 to the islands 2 on the other side, to serve as cathodes, is a delicate operation, and care must be exercised to ensure that the making of any one connection shall not interfere with connections already made. Such ensurance may conveniently be had by the use of a jig, for example in the form shown in FIG. 3, namely, a metal ring 11 bearing a glass disc 12 into which all necessary studs have already been molded. The studs should be equal in number to the sum of the connections to be made; in the illustrative case, four. One of these, 8, should preferably be molded in the approximate center of the glass disc 12 to serve as the common anode. The others, 10*a*, 10*b*, 10*c* intended for external connections to the individual cathodes 7, may be arranged in any desired pattern, for example at the apices of a triangle surrounding the central stud 8.

To ensure ready alloying of the central stud 8 to the wafer 1 and ready welding or soldering of the external studs to the gold wire cathodes, the studs should be plated with gold.

The bare P-type face of the wafer 1 is next securely fixed to the upper end of the central metal stud 8 by alloying under the influence of heat applied from an external source. Such alloy process, especially with a gold or a gold-plated stud, produces a low resistance ohmic connection 9 (FIG. 2) between the metal of the stud 8 and the P-type body 1.

Next, one or more spots of the upper surface of the wafer 1 are covered with a suitable acid-resistant wax. These spots, each to be later pierced by an electrode, may be as many in number as the compound diode being fabricated may require: in the illustration of FIG. 1, three. Each spot may be about 2 mils in diameter and the spots may be spaced apart by as little as 5–10 mils.

The wafer 1, attached on one side to the central stud 8 and bearing its waxed spots on the other side, is now etched with acid, e.g., a 5:1 mixture of nitric acid with hydrofluoric acid. The etching process should be continued until it has removed the N-type superficial layer from the wafer 1 except where the layer is protected from the acid by the wax. It thus leaves, for each protected spot, an island 2 rising above the level of the etched surface of the wafer 1 to a height of about 2 microns. This process restricts the diffused layer 3 and the subjacent diffused P-N junction 4 to a minute area in each island 2, on the sloping sides of which the diffused P-N junction 4 crops out.

The wax mask that still surmounts each island 2 is next removed by washing with a suitable solvent.

Figure 3:
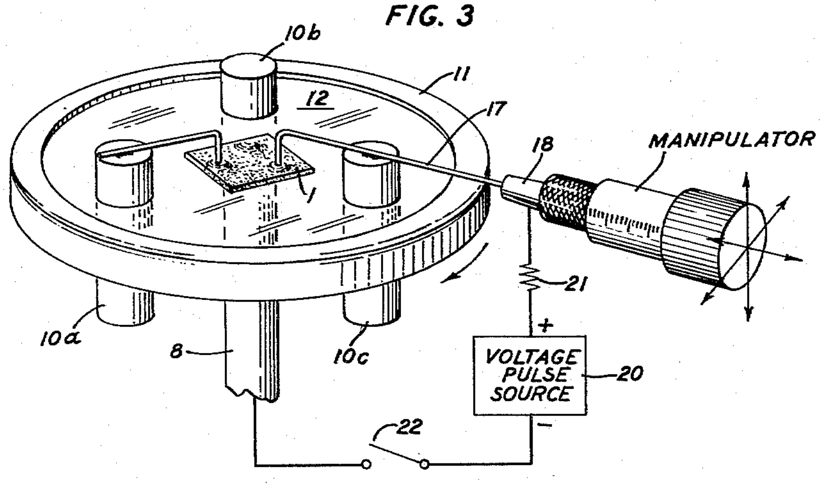
FIG. 3 is a diagram showing apparatus for carrying out a part of the process of the invention.

The jig 11, 12, bearing its studs 8, 10, and its wafer 1, is now rotatably mounted on a vertical axis in any convenient fashion, e.g., by grasping its peripheral metal ring 11 in a chuck. A short length 17 of gold wire which has previously been substantially doped with a donor impurity such as antimony, e.g., one per cent, is cleaned in an etching solution, for example a solution known as "CP4" of which the constitution is in the proportions of 20 cubic centimeters of nitric acid, 12 cubic centimeters of glacial acetic acid, 12 cubic centimeters of hydrofluoric acid, and 1.2–1.5 cubic centimeters of liquid bromine. The wire 17 thus cleaned is next mounted, in any convenient fashion, on the movable head 18 of a micromanipulator, as shown in FIG. 3.

A two-terminal source 20 of unipolarity voltage pulses, of controllable magnitude and duration, is connected to the mutually insulated parts of the apparatus, the negative terminal to the stud 8 bearing the wafer 1 and the positive terminal to the micromanipulator head 18 bearing the gold wire 17. This source 20 may be of any desired construction. As a matter of convenience it may utilize the principles of rapid condenser discharge, and it is adjusted to deliver a pulse having a duration of about two milliseconds and an amplitude that exceeds the breakdown voltage of the diffused junction 4 by a safe margin, e.g., 2.5 volts. Thus, with a diffused junction 4 which breaks down at 30 volts, the amplitude of the pulse should be 32.5 volts. (A greater excess, short of burn-out voltage, is not harmful; neither is it advantageous.)

In order to produce the heat required for the bonding process, it is desirable that a heavy current flow throughout the two microsecond duration of the pulse. The magnitude of this current may be controlled by the interposition, in series with the pulse source 20, of a protective resistor 21 of resistance 15 ohms or so.

All is now ready for the bonding operation which may be carried out as follows: First, the jig 11, 12 is rotated until one of the studs 10 lies under the shank of the gold wire 17 and the tip of the latter lies over one of the islands 2. The gold wire 17 is now brought down onto the center of the selected island 2, and with a force such that, upon removal of the mechanical resistance interposed by the hard surface of the island and under the influence of mechanical potential energy stored in the wire 17 and its supports, the wire would advance downward by about 0.2–0.3 mils. Finally, the start button 22 of the pulse source 20 is depressed. This applies the full voltage of the source 20, diminished only by the drop across the resistor 21, across two rectifiers in series, of which the first is the point contact rectifier which exists between the tip of the gold wire 17 and the N-type germanium layer 3 of the surface of the island 2, and the second is the diffused P-N junction 4 which lies below the N-type layer 3. The point contact rectifier is biased by the voltage of the source 20 in the forward direction and hence interposes only a low resistance. To the contrary, the diffused junction 4 is biased by the same voltage in the reverse direction and hence interposes a much higher resistance; indeed, the resistance of the diffused junction constitutes the major part of the resistance of the entire electric circuit. Hence, the heat generated by the flow of current originates principally at the diffused junction 4, and spreads outward from that junction through the N-type layer 3 toward the gold wire 17 and into the P-type body of the wafer 1.

When, in the course of this spread of heat, the area of contact between the gold wire 17 and the N-type layer 3 has reached the eutectic temperature of gold and germanium, melting commences to take place and the tip of the wire 17 commences to penetrate the N-type layer. As it advances toward the heat source, it enters regions of progressively higher temperatures so that melting takes place with even greater ease, and mechanical resistance to the advance of the electrode is progressively reduced. Accordingly, once penetration of the N-type layer 3 has started, it proceeds in rapid, avalanche fashion until the tip of the wire 17 has pierced the subjacent diffused P-N junction 4 and advanced somewhat beyond it into a region of the P-type body 1 which has not yet reached the eutectic temperature. Thereupon the molten alloy of gold and germanium which surrounds the tip of the wire freezes, to become a solid crystalline "regrowth" region 6. The entire penetration, piercing and freezing operations occupy no more than two milliseconds, the duration of the bonding current pulse. Therefore, no sooner has freezing taken place than the generation of heat is halted by cessation of the bonding current.

The bond to one of the layer-bearing islands 2 of the wafer 1 is now complete. The gold wire 17, however, is exceedingly delicate and must be secured to one of the studs 10 to serve as an external connection. The shank 17 of the gold wire is now connected, e.g., by welding, to the upper end of this stud 10 and the remainder of the wire is cut off. There is left a short length 7 of gold wire, connected by a bond at one end to the wafer 1, and by a weld at the other end to the stud 10. One entire cathode connection is now complete.

The connections to the remaining islands are now made in the same way: by grasping a new etch-cleaned gold wire 17 in the micromanipulator head 18, bringing it close to its assigned island 2 while rotating the jig 11, 12 until the shank of the gold wire 17 lies immediately over the assigned stud 10, engaging the wire tip with the center of the island 2, pressing the start button 22 of the pulse source 20, welding the shank of the gold wire 17 to the stud 10 and cutting off the tag end of the wire, to leave another short cathode connection 7, secured at both ends.

Microscopic examination of a diode rectifier fabricated in accordance with the foregoing process, after sectioning each one through the bond, reveals an internal structure illustrated in FIG. 2 which shows a portion of the P-type wafer body 1 having a low resistance ohmic connection 9 at its lower face to a mounting stud 8 which may serve as the anode of the rectifier, an N-type layer 3 formed by diffusion on a portion of its upper face and joined to the P-type body by a diffused P-N junction 4, and a wire electrode 7 of gold, alloyed with one percent of antimony, that has penetrated the layer 3, pierced the diffused junction 4, and entered the P-type body 1 and has there been frozen. Freezing of the gold-germanium eutectic melt at the interface provides a very thin "regrown" region 6 having the shape of a cap or dish of which the periphery, constituting a "bonded" N+-P junction 5, is contiguous with the inner boundary of the diffused junction 4 where it is pierced. Above the diffused junction 4, the gold-germanium alloy cap lies between donor-enriched germanium of N-type conductivity in the layer 3 and donor-enriched gold of the wire 7. In this position it has no rectifier properties, so that its surface outcrop, in a circle surrounding the gold wire 7, is not harmful. The diffused junction 4 crops out on the surface at the boundary between the P-type body 1 and the N-type layer 3. For reasons that are not fully understood, this outcrop is not harmful.

Figures 5, 6:
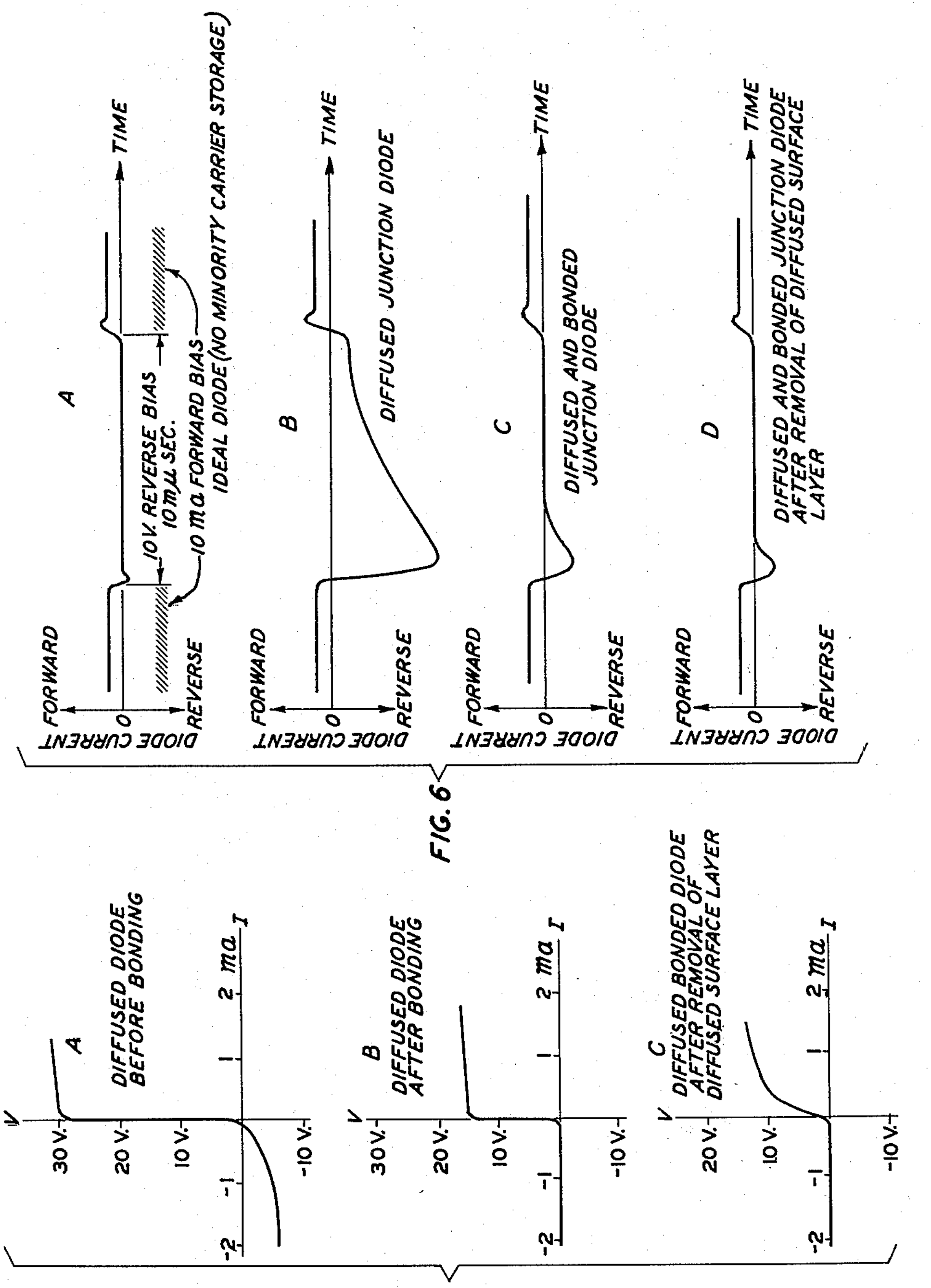
FIG. 5 is a group of current-voltage characteristics for rectifiers of various types.
FIG. 6 is a group of response curves for rectifiers of various types.

In FIG. 5, the curve A shows the current-voltage characteristic that is obtained when the gold wire 7 is first engaged with the N-type layer 3. It typifies the behavior of two rectifiers connected in series opposition. The portion of the graph in the first quadrant is that of the diffused junction 4 biased in its reverse direction while the portion in the third quadrant is that of the point contact rectifier biased in its reverse direction.

Observation of the current-voltage characteristic on an oscilloscope throughout the bonding process shows that, immediately penetration of the N-type layer 3 by the gold wire 17 commences, the characteristic of the curve A is replaced, practically instantaneously, by that of curve B. In curve B, the forward characteristic of the point contact rectifier has vanished and the reverse characteristic has changed from that typifying a diffused junction to that typifying a bonded junction.

If further, and in an effort to establish the origin of the improved characteristic of the curve B in unequivocal fashion, the superficial N-type layer 3 surrounding the gold electrode 7 be etched away so that the cap 6 and the bonded junction 5 now crop out at the surface of the P-type germanium in a circle immediately adjacent the gold wire, it is found that the characteristic now appears as in curve C of FIG. 5; i.e., a very inferior reverse characteristic typical of bonded junctions made to P-type germanium without benefit of the present invention.

The curves of FIG. 6 show the responses of diodes of four different constructions to a square voltage pulse of 10 millimicroseconds duration and of an amplitude such as to bias each diode in the reverse direction by a substantial margin, the diode being in each case biased in the forward direction before the application of the pulse and after its termination. Curve A shows the switching response of an ideal diode having no storage capacity for minority current carriers. The reverse current is composed of a brief capacitative pulse and the saturation current of the diode. Curve B shows the switching response, under the same conditions, of a typical diffused junction diode. Initially the reverse current is large, tailing off toward a small value at the conclusion of the pulse but requiring the full 10 millimicroseconds to do so. Curve C shows the response, to the same pulse, of a diode constructed as described above. Not only is the transient reverse current of much smaller magnitude but it falls sensibly to zero in about 3 millimicroseconds. This represents a marked improvement in switching speed over the performance of the diffused junction diode, as represented in curve B. Curve D shows the response, to the same pulse, of a diode fabricated as described above but from which the superficial N-type layer 3 has been removed after fabrication. It shows the response of the bonded junction 5 by itself to be fast. However, speed is not the only consideration: the current-voltage characteristic of curve C of FIG. 5 shows the diode, modified by removal of the auxiliary layer 3 to be inferior.

What is claimed is:

1. The method of fabricating a high-speed rectifier device of a body of germanium of P-type conductivity, which comprises diffusing donor impurities into the surface of said body, thereby to convert a thin surface layer of said body to N-type conductivity and to establish, at the interface between said layer and said body, a first rectifier junction, restricting said layer to a relatively small portion of the superficies of said body, alloying an ohmic connection to a P-type portion of said body, bringing into engagement with said layer an electrode composed of an inert metal having therein donor impurities in relatively large proportions, applying between said engaged electrode and said alloyed connection a voltage in excess of the breakdown voltage of said first junction and with a polarity to bias said first junction in the reverse direction, maintaining said voltage until heat, generated at said first junction, brings the point of engagement of said electrode with said layer to the eutectic melting temperature of germanium and said metal, whereupon said electrode explosively pierces said layer and said first junction and penetrates the P-type part of said body, limiting the current that flows in response to said voltage to an amplitude and a duration such that said electrode freezes to the P-type portion of said body immediately after piercing said first junction, the interface between said electrode and the P-type part of said body constituting a second, dished, junction of which the periphery is everywhere coterminous with the unpierced portion of the first junction, and thereupon removing said voltage.

2. The method of fabricating a high-speed rectifier device of a body of germanium of P-type conductivity, which comprises imparting N-type conductivity characteristics to at least a portion of the surface of said body, thus to establish at the interface between said surface portion and the remainder of said body a first rectifier junction, bringing into engagement with said surface portion an electrode composed of an inert metal containing donor impurities, applying between said engaged electrode and said P-type body a voltage in excess of the breakdown voltage of said first junction and with a polarity to bias said first junction in the reverse direction, thereby to cause said electrode explosively to penetrate said surface portion, to pierce said first junction and to freeze to said body, the interface between said electrode and said body constituting a second, dished junction of which the periphery is everywhere coterminous with the unpierced portion of the first junction, and thereupon removing said voltage.

3. The method of fabricating a high-speed rectifier device of a body of germanium of P-type conductivity, which comprises imparting N-type conductivity characteristics to at least a portion of the surface of said body, thus to establish at the interface between said surface portion and the remainder of said body a first rectifier junction, electrically biasing said first junction in the reverse direction, bringing into engagement with said surface portion an electrode composed of an inert metal containing donor impurities, causing said electrode to penetrate said surface portion and to pierce said first junction, and thereupon bonding said electrode to said body, the interface between said electrode and said body constituting a second, dished junction of which the periphery is everywhere coterminous with the unpierced portion of the first junction.

4. In the formation, in a body of germanium of P-type conductivity, of an integral regrown region of N-type conductivity separated from the parent body of a P-N junction to obtain a fused junction semiconductor device, the method which comprises the following steps: diffusing a donor impurity into a portion of a face of said body to form an N-type skin thereupon and to develop a first rectifier junction between said skin and said body, engaging with said skin an electrode generously enriched with donor impurities, and passing through said electrode and into said body a reverse current pulse of amplitude sufficient to break down the junction between said skin and said body and of energy sufficient to cause alloying of said electrode with said parent body to form said region, but of insufficient duration to hold said region in a molten state.

References Cited in the file of this patent

UNITED STATES PATENTS

| | | |
|---|---|---|
| 2,820,932 | Looney | Jan. 21, 1958 |
| 2,829,422 | Fuller | Apr. 8, 1958 |
| 2,842,723 | Koch et al. | July 8, 1958 |
| 2,842,831 | Pfann | July 15, 1958 |
| 2,849,664 | Beale | Aug. 26, 1958 |
| 2,862,160 | Ross | Nov. 25, 1958 |
| 2,919,386 | Ross | Dec. 29, 1959 |